United States Patent
Zimpfer et al.

(10) Patent No.: US 7,552,157 B2
(45) Date of Patent: Jun. 23, 2009

(54) BROAD-DYNAMIC FILTERING PROCEDURE FOR A RECURSIVE DIGITAL FILTER INSTALLED IN A SIGNAL PROCESSOR (DSP) OPERATING WITH INTEGERS

(75) Inventors: Veronique Zimpfer, Saint-Louis (FR); Karl Buck, Bartenheim (FR)

(73) Assignee: Institut Franco-Allemand de Recherches de Saint-Louis, Saint-Louis (FR)

( * ) Notice: Subject to any disclaimer, the term of this patent is extended or adjusted under 35 U.S.C. 154(b) by 0 days.

(21) Appl. No.: 11/281,534

(22) Filed: Nov. 18, 2005

(65) Prior Publication Data

US 2006/0069708 A1    Mar. 30, 2006

Related U.S. Application Data

(63) Continuation of application No. 09/966,260, filed on Oct. 1, 2001, now abandoned.

(51) Int. Cl.
*G06F 17/10* (2006.01)
(52) U.S. Cl. ..................................... 708/320
(58) Field of Classification Search .......... 708/300–323
See application file for complete search history.

(56) References Cited

U.S. PATENT DOCUMENTS

| | | | |
|---|---|---|---|
| 3,619,586 A | 11/1971 | Hoff et al. | |
| 4,195,350 A | 3/1980 | Moore | |
| 4,270,026 A * | 5/1981 | Shenoi et al. | 708/313 |
| 4,727,506 A | 2/1988 | Fling | |
| 4,972,356 A * | 11/1990 | Williams | 708/313 |
| 5,089,981 A * | 2/1992 | Cabot | 708/320 |
| 5,282,155 A * | 1/1994 | Jones | 708/322 |
| 5,523,962 A | 6/1996 | Yoshino et al. | |
| 5,590,121 A * | 12/1996 | Geigel et al. | 708/322 |
| 5,694,474 A | 12/1997 | Ngo et al. | |
| 5,757,362 A | 5/1998 | Levine | |
| 5,798,954 A * | 8/1998 | Ishibata | 708/320 |
| 5,999,954 A * | 12/1999 | Ludwig et al. | 708/312 |
| 5,999,955 A | 12/1999 | Davis, Jr. et al. | |
| 6,216,145 B1 | 4/2001 | Zandi et al. | |
| 6,279,020 B1 | 8/2001 | Dujardin et al. | |
| 6,300,823 B1 * | 10/2001 | Zhou et al. | 708/317 |
| 6,363,112 B1 * | 3/2002 | Azadet et al. | 708/323 |
| 6,509,889 B2 | 1/2003 | Kamper et al. | |
| 6,826,226 B1 * | 11/2004 | Sahlin et al. | 708/323 |
| 6,871,207 B1 * | 3/2005 | Nanda et al. | 708/313 |
| 6,983,012 B1 * | 1/2006 | Shen | 708/319 |
| 2001/0032225 A1 | 10/2001 | Tal et al. | |

FOREIGN PATENT DOCUMENTS

JP    A 6-3243    1/1994

* cited by examiner

*Primary Examiner*—Chat C Do
(74) *Attorney, Agent, or Firm*—Oliff & Berridge, PLC

(57) ABSTRACT

The present invention relates to a filtering procedure for recursive digital filters installed in signal processors (DSP) operating with integers. It comprises two calculation procedures coupled with the classical calculation procedure of a recursive filter, the first of which, when calculating the output value of the sample, takes into account the remainders of integer divisions by the scale factor, coming from calculating the output values for the previous samples, and the second of which replaces the default value from dividing the integer by a scale factor by the integer value closest to the result of actual division.

5 Claims, 5 Drawing Sheets

BROAD-DYNAMIC FILTERING PROCEDURE FOR A RECURSIVE DIGITAL FILTER INSTALLED IN A SIGNAL PROCESSOR (DSP) OPERATING WITH INTEGERS

This is a Continuation of application Ser. No. 09/966,260 filed Oct. 1, 2001 (now abandoned). The entire disclosure of the prior application is hereby incorporated by reference herein in its entirety.

BACKGROUND OF THE INVENTION

The technical field of the present invention is that of recursive digital filters (with infinite impulse response or IIR) and their industrial applications. These filters are used in particular, but not exclusively, in the field of noise reduction, for making active sound protection devices. They can also be used in regulation systems employing negative feedback loops.

In this area, several designs have already been proposed. They are based on converting an input signal x(n) at a given moment in time, that comes from sampling at a given frequency, into an output signal y(n) deduced therefrom by a specific calculation procedure. The calculation procedure is defined by coefficients $a_j$ and $b_i$ of the function F(z) representing the filter transfer function in its general form in the complex plane $$F(Z) = \frac{1}{K} \frac{\sum_{i=0}^{P} b_i \cdot Z^{-1}}{1 + \sum_{j=1}^{q} a_j \cdot Z^{-1}}$$

or the finite-difference equation which give the value of the output signal as a function of the input and output values for the previous samples n−i or n−j:

$$y(n) = \frac{1}{K} \sum_{i=0}^{P} (b_i \cdot x(n-i)) - \sum_{j=1}^{q} (a_j \cdot y(n-j))$$

where K designates a coefficient enabling the filter gain to be regulated and Z is a complex number such that $Z = \exp(2\pi j f)$ where f is the reduced frequency, a unitless value between 0 and 1, defined by the actual frequency of the signal expressed in Hz divided by the sampling frequency also expressed in Hz, and where j is the complex number such that $j^2 = -1$.

The general form of recursive digital filters can then be represented by the schematic diagram in FIG. 1, where $Z^{-1}$ is the operator for passing from sample n to sample n−1.

These filters are generally implemented by a series of second-order filters (filters employing only the input and output values of the two previous samples), disposed in parallel (parallel form) or in a cascade (cascade form), with a transfer function which is then written as follows, for the parallel and cascade filters respectively:

$$F(Z) = \prod_{i=1}^{m} F_i(Z) \text{ or } F(Z) = \sum_{i=1}^{m} F_i(Z)$$

where $F_i(Z)$ represents the transfer function of each second-order recursive elementary filter.

Each cell (second-order recursive elementary filter) is thus defined only by the five coefficients $a_1$, $a_2$, $b_0$, $b_1$, and $b_2$.

These filters, of whatever order, have the disadvantage of being implementable only after quantification of their coefficients into integers, namely with truncation of the decimals, which occurs only after the actual coefficients $a_j$ and $b_i$ have been multiplied by a scale factor. This scale factor increases the possible choice of integer coefficients used in the calculation, while the actual coefficients lie between −2 and 2, at most. This truncation brings about an error which translates into non-linearities of the filter, making it unsuitable for the desired filtering function. To minimize the effect of quantification of integer coefficients, the filter must be made of a succession of second-order filters in a cascade (cascade form). To this error, associated with the coefficients, is added the rounding error that occurs when integers are divided by the scale factor. This rounding error propagates from sample to sample as the calculations are made. It can become very large, hence non-negligible when the filter is operating in the low-frequency range. This error is made even greater if the result of integer divisions by the scale factor is considered to be the default integer value instead of the closest integer value to the result of actual division.

SUMMARY OF THE INVENTION

The goal of the invention is to remedy these drawbacks by proposing a calculation method that avoids propagation of rounding errors and which uses the closest integer to the result in integer divisions.

For this purpose, the invention proposes to complete the output signal calculation procedure by taking into account the remainders of integer divisions carried out when the output signal from previous samples is calculated. Further, the invention completes the output signal calculation procedure by a procedure replacing rounding to the default integer value when dividing by the scale factor by rounding to the closest integer of the actual-value result.

BRIEF DESCRIPTION OF THE DRAWINGS

The invention will be described with reference to the figures in which.

DETAILED DESCRIPTION OF THE PREFERRED EMBODIMENT

The invention completes the output signal calculation procedure by taking into account the remainders of integer divisions carried out when the output signal from the previous samples is calculated. This calculation is done according to the following equation (here indicated in the particular case of a second-order cell):

$$y(n) = Q\left(\frac{Q\left(\frac{scf \cdot x(n) + b_1 \cdot x(n-1) + b_2 \cdot x(n-2)}{K}\right) - a_1 \cdot y(n-1) - a_2 \cdot y(n-2) + Q\left(\frac{-a_1 \cdot r(n-1) - a_2 \cdot r(n-2)}{scf}\right)}{scf}\right)$$

instead of:

$$y(n) = Q\left(\frac{Q\left(\frac{scf \cdot x(n) + b_1 \cdot x(n-1) + b_2 \cdot x(n-2)}{K}\right) - a_1 \cdot y(n-1) - a_2 \cdot y(n-2)}{scf}\right)$$

for a classical calculation of an implemented recursive digital filter in which Q( ) is the non-linear quantification operator when integers are divided and "scf" is the scale factor chosen.

These formulas of course need to be adapted by increasing the number of elements in the calculation ($a_1$, $a_2$, $a_3$, ..., $b_1$, $b_2$, $b_3$, ..., n−1, n−2, n−3, ...) if the filters to be made are multiple-order filters.

The invention also completes the output signal calculation procedure by a procedure replacing rounding to the default integer value when dividing by the scale factor by rounding to the closest integer of the actual-value result.

This being the case, it is possible to show that the error between the calculated value y(n) and the theoretical value th(n) that would be obtained without the rounding errors is independent of the errors committed in the previous iterations. Hence there is no more propagation phenomenon and thus no error amplification. The error, of rank n, is thus minimized and the filter obtained can carry out its filtering function whatever the amplitude of the input signal. The dynamics of the filter thus made may exceed 60 dB, i.e. the error remains negligible even if the amplitude of the input signal is between the maximum amplitude and the maximum amplitude minus 60 dB (maximum amplitude/1000).

Figure 4:
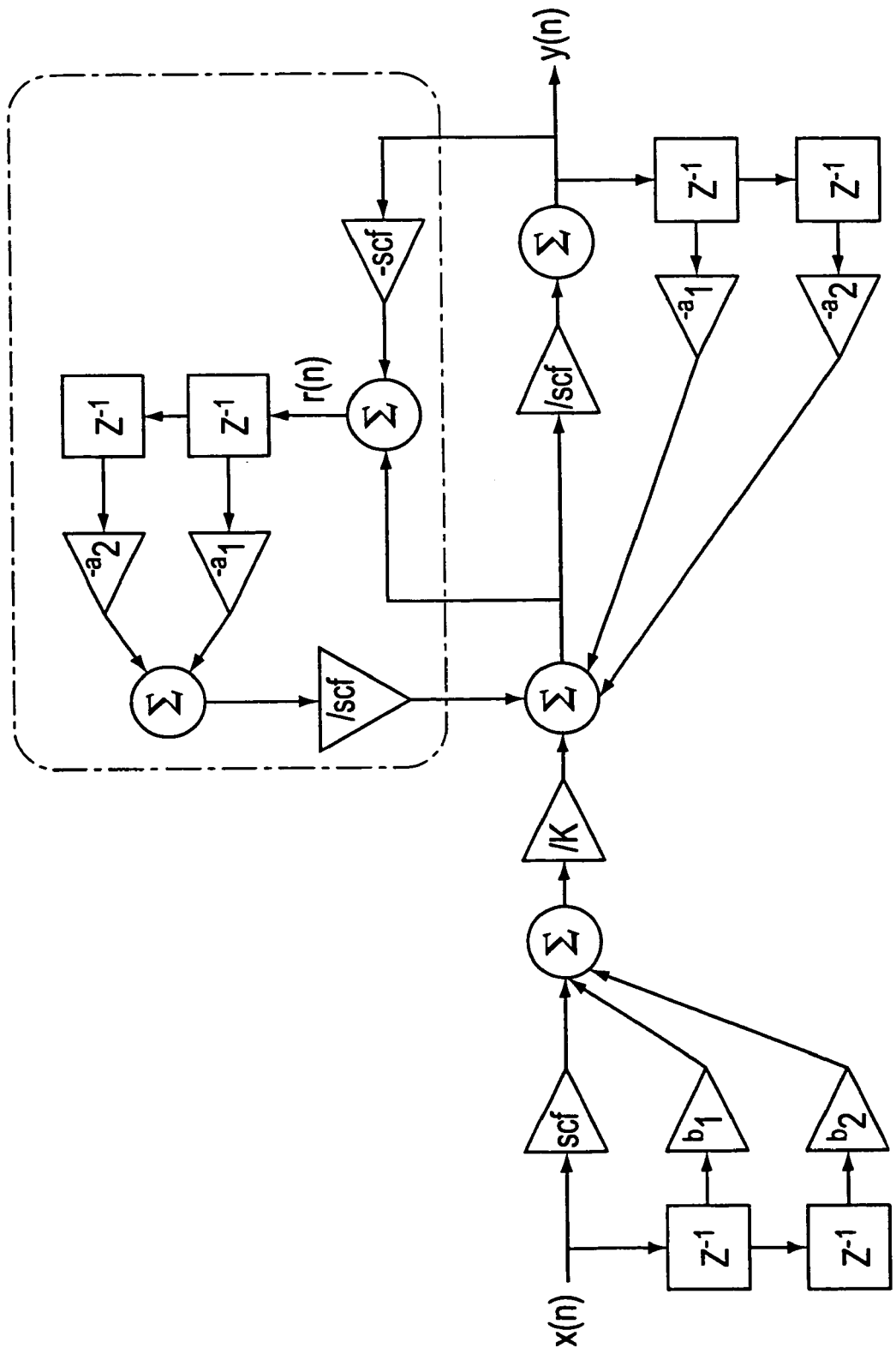
FIG. 4 illustrates a rounding error non-propagation procedure.

Principally, the invention involves a rounding error non-propagation procedure, illustrated in FIG. 4, in which:

the output signal is picked up and multiplied by the scale factor; and after changing the sign of the result, the result is added to the value of the output signal obtained before dividing by the scale factor to obtain the remainder of integer division of rank n;

operator $Z^{-1}$ is applied to the remainder to obtain the remainder of division in the calculation of the sample of rank n−1, to which multiplication by the coefficient $-a_1$ is applied;

operator $Z^{-1}$ is applied to this value once again to obtain the remainder of division in the calculation of the sample of rank n−2, to which multiplication by the coefficient $-a_2$ is applied;

and so forth up to the rank used for the filter order; and the results are summed, the resulting sum is divided by the scale factor, and the value thus obtained is added to the calculation of the output signal.

Figure 3:
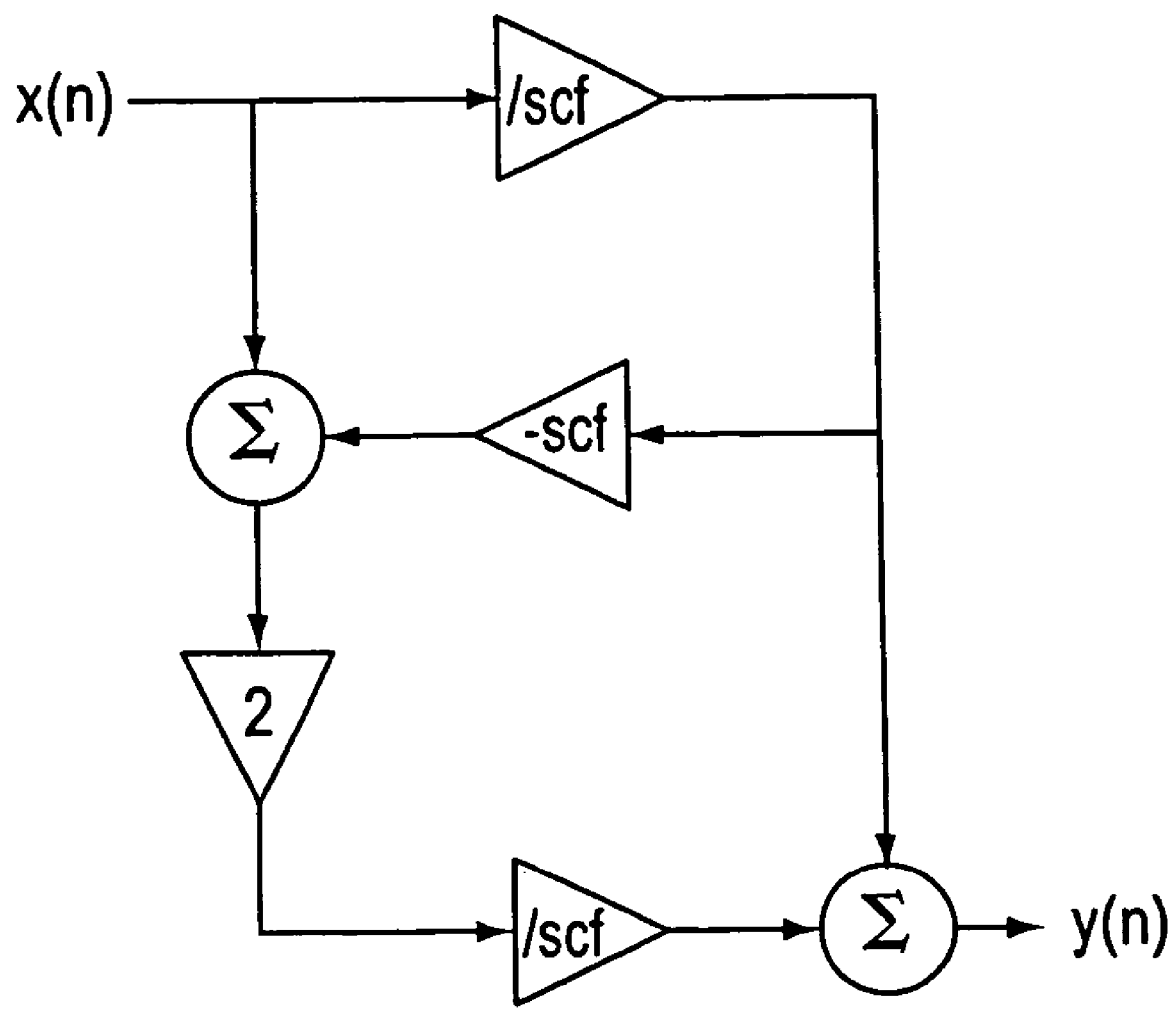
FIG. 3 illustrates an improved division procedure.

The calculation procedure defined in the invention also advantageously, but not necessarily, involves a procedure known as an improved division procedure, illustrated in FIG. 3, which consists of dividing the signal by the scale factor and then multiplying it again by the scale factor to subtract it from the initial signal; the result of this subtraction is multiplied by two and then divided by the scale factor and finally added to the initial signal after dividing the latter by the scale factor.

Figure 1:
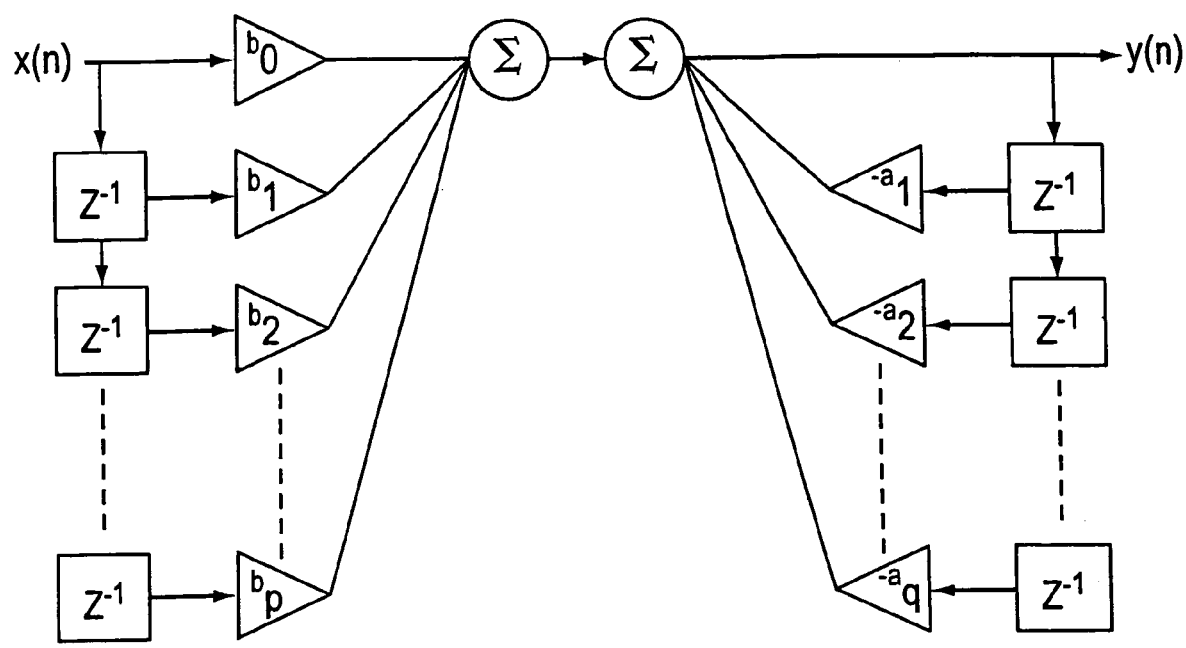
FIG. 1 is a general form of a recursive digital filter.
Figure 2:
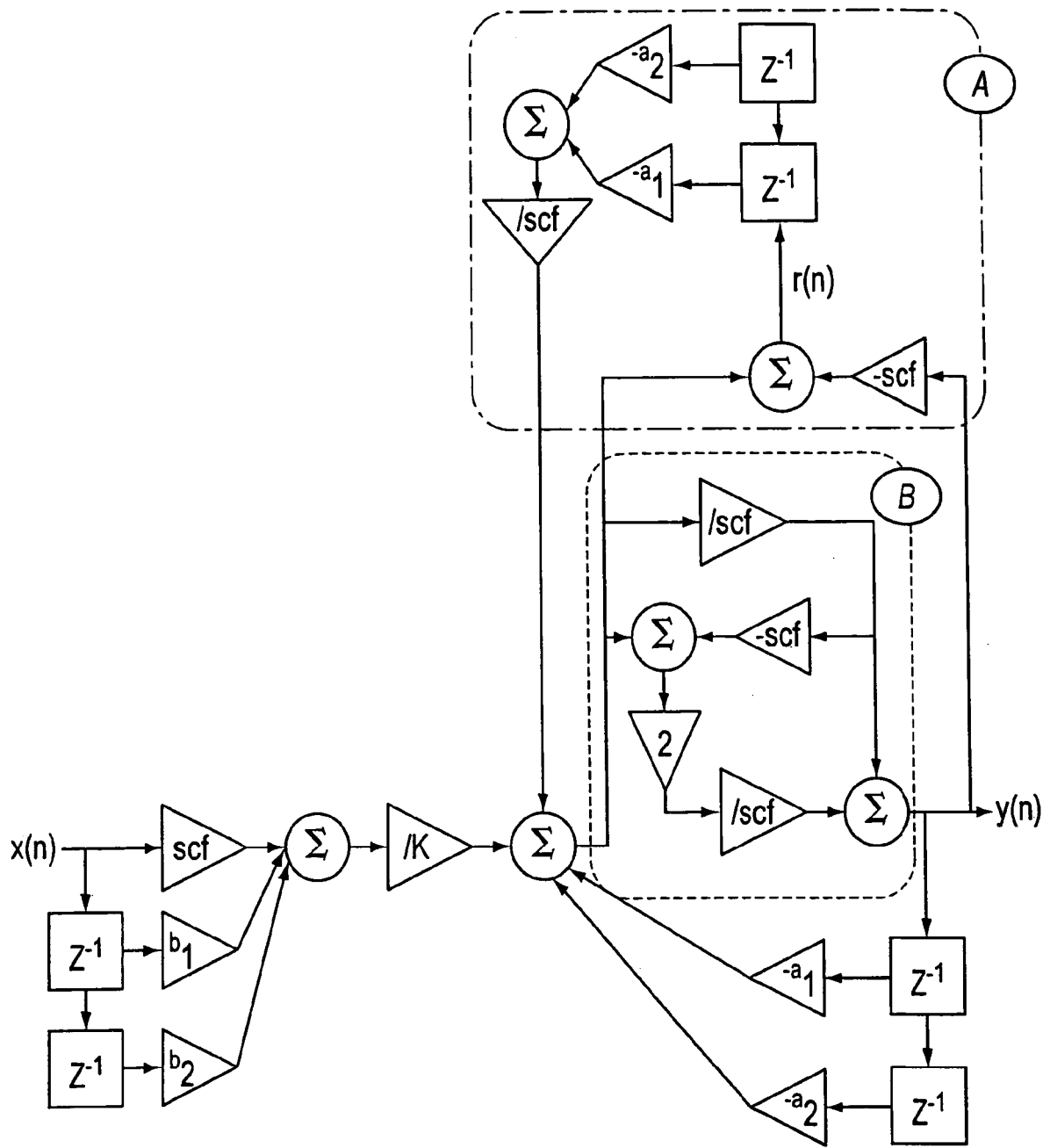
FIG. 2 shows calculation of the output signal for a second order cell.

FIGS. 2 to 4 illustrate the calculation procedure according to the invention, limited to a second-order cell. For a digital filter made of m second-order cells in cascade, the invention consists of applying, for each of the m cells, the calculation of its output signal which is shown in FIG. 2. The input signal of the i-th cell is the output signal of the previous cell.

FIG. 2 shows the complete procedure for a second-order cell, with identification of the rounding error non-propagation procedure by a dot-dashed line (alternating dots and dashes) and the letter A placed in an ellipse, and identification of the improved division procedure by a dotted line and the letter B also placed in an ellipse. In the figure, x(n) is the input signal, y(n) is the output signal, and r(n) is the remainder of dividing by the scale factor. Assuming that the digital filter is composed of several second-order cells in cascade, the procedure must be repeated for each one.

FIG. 3 shows an improved division procedure, separately from the complete procedure for calculating the output signal for a second-order cell.

FIG. 4 shows the complete calculation procedure for a second-order cell when it is carrying out only the rounding error non-propagation procedure. Assuming that the digital filter is composed of several second-order cells in cascade, the procedure must be repeated for each cell.

Figure 5:
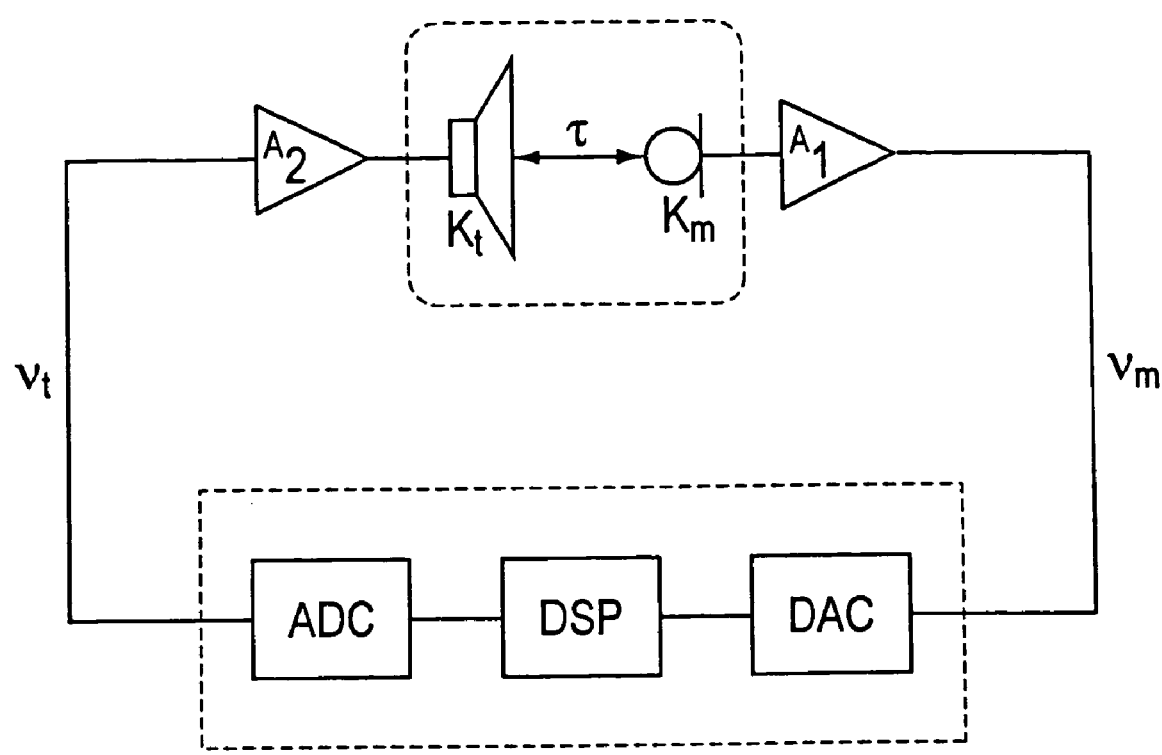
FIG. 5 illustrates a digital active system for hearing protection.

FIG. 5 summarizes a digital active system for hearing protection, based on the filtering which is the subject of the invention. The upper dashed line represents the protective helmet and the lower dashed line, the digital filter. The DAC and ADC modules represent the digital/analog and analog/digital converters which, associated with signal processor DSP, are the components of the digital filter.

A particular embodiment of the invention is shown in FIG. 2. In this example it is made of a single second-order cell. The signal x(n) entering upon iteration n is multiplied by the scale factor; it is added to the two values obtained by multiplying the signals entering upon iterations n−1 and n−2 by the coefficients $b_1$ and $b_2$, respectively. The value thus obtained is divided by the gain K used for the second-order cell. The following are added to this value:

the values obtained by multiplying the exiting signals from iterations n−1 and n−2 by coefficients $(-a_1)$ and $(-a_2)$, respectively; and the result of the calculation known as the rounding error non-propagation calculation, namely the value obtained by subtracting, from the value arrived at by this sum, the value of the output signal y(n) after multiplication by the scale factor, then applying to this value the operator $Z^{-1}$ to obtain the remainder of dividing by the scale factor that comes from calculating the output signal for sample n−1, then again applying this operator to obtain the remainder of dividing by the scale factor that comes from calculating the output signal for sample n−2, then summing these remainders after multiplication by coefficients $(-a_1)$ and $(-a_2)$ respectively and, finally, dividing by the scale factor.

The value emerging from this calculation is then modified to obtain the output value y(n) by the procedure known as the improved division procedure, which comprises picking up the signal coming from the sum operator, dividing it by the scale factor, then multiplying it again by the scale factor to subtract it from the signal as picked up, then multiplying this result by two then dividing it by the scale factor, and finally adding it to the signal as picked up once the latter has been divided by the scale factor.

Implementation in a DSP type signal processor working with integers of a filter of the type described in the invention can be effected as follows:

An analogic/digital and digital/analog signal converter is used upstream and downstream of the signal processor, the signal processor preferably having preferably 16 bits or more so that that the error due to conversions is negligible compared to the signal amplitude.

To avoid an additional error by exceeding the dynamics of the DSP, an integer less than or equal to $2^{p-b-2}$ is chosen as the scale factor, where p designates the length of the DSP words and b designates the resolution of the converters (number of bits on which the converters code the signal).

It is preferable to use a scale factor and a gain coefficient K that are multiples of two in order to minimize calculation time. In this way, all dividing, which is slow in a DSP, can be replaced by register shifts which are much faster.

Finally, the larger the scale factor, the smaller the error due to quantification of the coefficients and the larger the number of filters that can be made. Hence it is preferable to use a DSP with a word length of 32 bits. This enables the value $scf=2^{32-16-2}=2^{14}=16384$ to be taken for the scale factor.

With a filter of this type, signal dynamics exceeding 60 dB can be effectively filtered.

One practical application of these filters is active noise protection, which requires a broad usable amplitude range whatever the filter implemented. The digital filter then used is an IIR type filter in its cascade form. Each filtering cell is implemented in the DSP using the calculation procedure according to the invention represented in FIG. 2.

The invention can also be used for regulation, using negative feedback loops, because the low error propagation level can enable analog filtering procedures to be replaced by digital procedures.

What is claimed is:

1. A recursive digital filter implemented in a signal processor working with integers, comprising:
   a receiving section that receives an input signal;
   a calculating section that calculates an output signal of a sample n from the input signal based on:
      an algebraic sum of input and output values of signals sampled at a selected point in time and at previous points in time, to which coefficients characteristic of the filter have been assigned; and
      a sum of the remainders of integral divisions, for each of said previous points of time, of the corresponding output value by a scale factor, said remainders to which coefficients characteristic of the filter have been assigned, the output values being rounded by the sum of the remainders to the closest integer, whereby the propagation of error amplification is minimized;
   a changing section that changes a number obtained from rounding to a default integer value that is obtained from dividing an output value by the scale factor based on a number obtained from rounding to a closest integer to a real-number quotient thereof; and
   an outputting section that outputs the calculated output signal.

2. An active sound protection system comprising the recursive digital filter according to claim 1.

3. A negative feedback regulation system comprising the recursive digital filter according to claim 1.

4. A method for producing a recursive digital filter, implemented in a signal processor working with integers, the method comprising:
   receiving an input signal;
   calculating an output signal of a sample n from the input signal based on:
      an algebraic sum of input and output values of signals sampled at a selected point in time and at previous points in time, to which coefficients characteristic of the filter have been assigned; and
      a sum of the remainders of integral divisions, for each of said previous points of time, of the corresponding output value by a scale factor, said remainders to which coefficients characteristic of the filter have been assigned, the output values being rounded by the sum of the remainders to the closest integer, whereby the propagation of error amplification is minimized;
   changing a number obtained from rounding to a default integer value that is obtained from dividing an output value by the scale factor based on a number obtained from rounding to a closest integer to a real-number quotient thereof; and
   outputting the calculated output signal.

5. The method of claim 4, wherein the calculation of the output signal is performed during a single cycle of the recursive digital filter.

* * * * *